(12) United States Patent
Wessendorf

(10) Patent No.: US 6,624,708 B1
(45) Date of Patent: Sep. 23, 2003

(54) ACTIVE SHUNT CAPACITANCE CANCELLING OSCILLATOR CIRCUIT

(75) Inventor: Kurt O. Wessendorf, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 10/183,112

(22) Filed: Jun. 25, 2002

(51) Int. Cl.$^7$ ................................................ H03B 5/32
(52) U.S. Cl. .................................... 331/158; 331/116 R
(58) Field of Search ................................ 327/103, 105, 327/101, 100, 362; 331/154, 155, 158, 162, 116 R, 109

(56) References Cited

U.S. PATENT DOCUMENTS

| | | | |
|---|---|---|---|
| 5,201,215 A | 4/1993 | Granstaff | 73/54.41 |
| 5,327,106 A * | 7/1994 | Sanders | 331/109 |
| 5,416,448 A | 5/1995 | Wessendorf | 331/116 R |
| 5,606,295 A * | 2/1997 | Ohara et al. | 331/116 FE |
| 5,661,233 A | 8/1997 | Spates | 73/61.45 |
| 5,706,840 A | 1/1998 | Schneider | 134/56 R |
| 5,741,961 A | 4/1998 | Martin | 73/32 |
| 5,798,452 A | 8/1998 | Martin | 73/32 |
| 5,827,952 A | 10/1998 | Mansure | 73/61.45 |
| 6,225,871 B1 * | 5/2001 | Chien | 331/117 FE |

OTHER PUBLICATIONS

W.–K. Chen, Ed., *The Circuits and Filters Handbook*, (CRC Press, New York, 1995), pp. 349–351, 1619–1624, 1694–1695, 1700–1701.

D.G. Fink and D. Christiansen, Eds., *Electronics Engineers' Handbook*, (McGraw–Hill, New York, 1989), pp. 8–46–8–47.

* cited by examiner

*Primary Examiner*—Dinh T. Le
(74) *Attorney, Agent, or Firm*—John P. Hohimer

(57) ABSTRACT

An oscillator circuit is disclosed which can be used to produce oscillation using a piezoelectric crystal, with a frequency of oscillation being largely independent of any shunt capacitance associated with the crystal (i.e. due to electrodes on the surfaces of the crystal and due to packaging and wiring for the crystal). The oscillator circuit is based on a tuned gain stage which operates the crystal at a frequency, f, near a series resonance frequency, $f_S$. The oscillator circuit further includes a compensation circuit that supplies all the ac current flow through the shunt resistance associated with the crystal so that this ac current need not be supplied by the tuned gain stage. The compensation circuit uses a current mirror to provide the ac current flow based on the current flow through a reference capacitor that is equivalent to the shunt capacitance associated with the crystal. The oscillator circuit has applications for driving piezoelectric crystals for sensing of viscous, fluid or solid media by detecting a change in the frequency of oscillation of the crystal and a resonator loss which occur from contact of an exposed surface of the crystal by the viscous, fluid or solid media.

26 Claims, 4 Drawing Sheets

ACTIVE SHUNT CAPACITANCE CANCELLING OSCILLATOR CIRCUIT

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to electronic oscillator circuitry, and in particular to an oscillator circuit for a piezoelectric crystal which compensates for and effectively cancels out any shunt capacitance associated with the piezoelectric crystal thereby improving the ability of the crystal to continue to oscillate although contacted by a viscous, fluid or solid medium and to enable more accurate measurements of characteristics (e.g. density and viscosity) of the medium.

BACKGROUND OF THE INVENTION

Piezoelectric crystals can be used to sense properties a viscous medium or changes in the properties thereof when the viscous medium is brought into contact with a surface of the piezoelectric crystal when the crystal is electrically activated into resonance (see e.g. U.S. Pat. No. 5,201,215 which is incorporated herein by reference). The electrical activation of the crystal can be performed by placing the crystal into an oscillator circuit which generally operates at a frequency corresponding to an odd multiple of one-half of an acoustic wavelength of the crystal so that at resonance a standing shear wave is generated across the thickness of the crystal. Contact of a surface of the crystal by the viscous medium results in a decrease in the oscillation frequency of the crystal and a damping of the resonance which can be used to ascertain characteristic properties (e.g. viscosity and density) of the medium. To sustain oscillation of the crystal during contact with the viscous medium, an electrical circuit driving the crystal must be capable of operating over a wide dynamic range of resonator loss, $R_m$. This dynamic range of $R_m$ can be over several orders of magnitude. A shunt capacitance associated with the crystal detrimentally affects the performance of the oscillator circuit by making operation at a series resonance, $f_s$, difficult and by limiting the dynamic loss range that the oscillator can tolerate. The series resonance, $f_s$, is defined herein as the frequency where an inductance $L_m$ and a capacitance $C_m$ of a motional arm of the piezoelectric crystal are in resonance. At this frequency $f_s$, if a shunt capacitance, $C_0$, and a parasitic capacitance, $C_p$, associated with the piezoelectric crystal are both small, then the crystal impedance is real and the oscillator circuit of the present invention is a real impedance phase oscillator which operates at or near a zero degree impedance phase angle.

A Lever oscillator circuit that has previously been used to drive a quartz crystal resonator for fluid sensing applications is disclosed in U.S. Pat. No. 5,416,448 which is incorporated herein by reference. The present invention represents an improvement over this prior art oscillator circuit by providing a circuit design which more accurately operates at $f_s$ with a large resonator shunt capacitance and which does not require automatic level control circuitry to determine $R_m$. The present invention provides for operation of a piezoelectric crystal over a wide range of resonator loss by effectively cancelling out the shunt capacitance of the resonator via an active circuit and a dummy capacitance (i.e. a reference capacitor). The oscillator circuit of the present invention has a relatively small component count compared to prior circuits employing automatic gain control circuitry as disclosed in U.S. Pat. No. 5,416,448, thereby permitting the oscillator circuit of the present invention to be formed as a discrete circuit or as an integrated circuit (IC) with a reduced size, a reduced power consumption and a reduced manufacturing cost.

SUMMARY OF THE INVENTION

The present invention relates to a oscillator circuit for operating a piezoelectric crystal at a frequency of oscillation near a series resonance of the crystal. The oscillator circuit comprises a tuned gain stage which includes a limiting amplifier located in a feedback loop about a transistor, with a non-inverting output of the transistor being connected to drive the crystal at the frequency of oscillation, and with an inverting output of the transistor being connected to a resonant tank circuit to suppress oscillation of the crystal at frequencies other than near the series resonance. The oscillator circuit also includes a compensation circuit that effectively cancels any shunt capacitance associated with the piezoelectric crystal. The compensation circuit receives an input from the output of the limiting amplifier, with the compensation circuit providing an output that is connected to the crystal at the non-inverting transistor output. The compensation circuit is advantageous in that the oscillator circuit operating at a zero-impedance phase will oscillate at the series resonance frequency, $f_s$, of the piezoelectric crystal independent of any shunt capacitance associated with the crystal thereby effectively cancelling out any effect on the frequency of oscillation due to the shunt capacitance. Thus, the compensation circuit acts to provide all the current flow through the shunt capacitance so that the oscillator circuit need not supply this current flow. The shunt capacitance associated with the crystal is defined herein as being the sum of a static capacitance, $C_0$, which arises from internal fields across the crystal and any parasitic capacitance, $C_p$, due to packaging of the crystal and wiring thereto.

The resonant tank preferably comprises a low-Q tank circuit that is used to connect the oscillator circuit to a power supply. This resonant tank peaks the gain of the tuned gain stage in a desired frequency range near the series resonance, $f_s$, and helps to reject unwanted modes of oscillation. The tuned gain stage can further include a current source provided between the non-inverting transistor output and an electrical ground for direct-current (dc) biasing of the transistor.

The limiting amplifier is preferably a differential amplifier with one input connected to an inverting output of the transistor, and with another input being electrically grounded at the frequency of oscillation. The output of the limiting amplifier is connected to the input of the transistor to provide positive feedback for oscillation. The limiting amplifier also preferably provides a frequency output signal that is representative of the frequency of oscillation of the crystal, and a dc voltage output signal that is representative of a resonator loss component, $R_m$, of the crystal.

The compensation circuit further includes a current mirror which provides dc and alternating-current (ac) current components at the non-inverting output of the transistor, with the ac current component being equal in magnitude and phase to a current flow through the shunt capacitance associated with the crystal at the frequency of oscillation. This ac current component effectively cancels out any shunt of the crystal due to the shunt capacitance by providing all the current flow through the shunt capacitance independent of the gain stage.

The value of this ac current component is determined by a reference capacitor located in the compensation circuit. The reference capacitor is selected to have a value of capacitance that is equal to the shunt capacitance associated with the crystal. This can be done, for example, by providing the reference capacitor as a variable capacitor and tuning the variable capacitor during a calibration of the oscillator circuit.

The oscillator circuit of the present invention can operate the crystal with one side electrically grounded, and with a frequency of oscillation that is generally in the range of 1–100 MHz. This circuit can be formed as a discrete circuit using discrete components, or alternately can be formed, at least in part, as an integrated circuit (IC). Embodiments of the oscillator circuit of the present invention can be formed using either bipolar transistors or field-effect transistors (FETs). When the oscillator circuit is formed as an IC, certain components (e.g. the reference capacitor and tank circuit) can be outboard to the IC to allow adaptation of the IC to many different types of applications, or to different types and sizes of piezoelectric crystals.

The present invention also relates to an oscillator circuit to provide for oscillation of a piezoelectric crystal, with the oscillator circuit comprising a transistor having a limiting amplifier connected in a positive feedback configuration between an inverting output of the transistor and an input thereof, and with the oscillator circuit further including a compensation circuit for effectively cancelling out the shunt capacitance associated with the crystal. The piezoelectric crystal is connected to a non-inverting output of the transistor with the other side of the crystal being electrically grounded. The compensation circuit provides an ac current component at the non-inverting output which is equal in magnitude and phase to a current flowing through the shunt capacitance. As a result, the compensation circuit completely supplies any required current flow through the shunt capacitance; and this effectively cancels out any effect of the shunt capacitance on the oscillator circuit, or on a frequency of oscillation, f, of the crystal. Effectively cancelling out the shunt capacitance also allows the piezoelectric crystal to oscillate over a wide range of damping when placed into contact with a viscous, fluid or solid medium.

In this oscillator circuit, the limiting amplifier comprises a differential amplifier with a first amplifier input being capacitively coupled to the inverting output of the transistor, and with a second amplifier input being capacitively coupled to an electrical ground. The limiting amplifier is also preferably configured to provide a frequency output signal to indicate the frequency of oscillation of the crystal, and a dc voltage output signal to indicate a resonator loss component, $R_m$, within the crystal.

The compensation circuit comprises a current mirror for providing the ac current component. The magnitude and phase of the ac current component provided by the current mirror is determined using a reference capacitor connected to the current mirror through another transistor whose input is connected to the output of the limiting amplifier. The reference capacitor can be adjustable (i.e. a variable capacitor) to allow for a precise adjustment of the magnitude of the ac current from the current mirror in order to cancel out the loading due to the shunt capacitance associated with the crystal.

The present invention further relates to an oscillator circuit for operating a piezoelectric crystal at a frequency of oscillation near a series resonance, $f_s$. This oscillator circuit comprises a first transistor having a limiting amplifier connected in a positive feedback configuration between an inverting output of the first transistor and an input thereof, with a non-inverting output of the first transistor being further connected to one side of the piezoelectric crystal, and with the other side of the piezoelectric crystal being electrically grounded. In this circuit, a current mirror is connected between an inverting output of a second transistor and the non-inverting output of the first transistor, with the second transistor further having an input connected to the first transistor input. The current mirror generates an ac current component at the frequency of oscillation that is sufficient to supply any current flowing through a shunt capacitance associated with the piezoelectric crystal. This effectively cancels out the shunt capacitance, and allows the crystal to operate over a wide dynamic range of motional resistance, $R_m$, which changes in response to contact of an exposed surface of the crystal by a viscous, fluid or solid medium. The magnitude of the ac current component provided by the current mirror can be determined by a reference capacitor which can be a variable capacitor.

Current sources are preferably provided within the oscillator circuit at the non-inverting outputs of each transistor (i.e. in parallel with the piezoelectric crystal, and in parallel with the reference capacitor) to establish dc bias levels for these transistors. The functional elements of the oscillator circuit (e.g. the first and second transistors, the limiting amplifier and the current mirror) can be optionally formed as an IC.

The present invention also relates to an oscillator circuit for operating a piezoelectric crystal at a frequency of oscillation near a series resonance (i.e. a series resonance frequency). This oscillator circuit comprises a first transistor having an input, an inverting output and a non-inverting output, with the piezoelectric crystal being connected between the non-inverting output and a ground connection to a power supply, and with the inverting output of the first transistor being connected to the power supply through a resonant tank circuit. A first current source is connected between the non-inverting output of the first transistor and the ground connection in parallel with the piezoelectric crystal; and a second current source is connected between the non-inverting output of a second transistor and the ground connection in parallel with a reference capacitor. This second transistor has its input connected to the input of the first transistor and further connected to the output of a limiting amplifier which is located in a feedback loop between the inverting output of the first transistor and the inputs of both transistors to provide the positive feedback necessary for oscillation of the crystal.

A current mirror is also used in the oscillator circuit and is connected between the inverting output of the second transistor and the power supply to generate an ac current component at the frequency of oscillation and provide this ac current component to the non-inverting output of the first transistor. The magnitude of the ac current component is controlled and determined by the reference capacitor so that the magnitude of the ac current component is equal to that of an ac current flowing through a shunt capacitance associated with the piezoelectric crystal. As a result, the shunt capacitance on the oscillator circuit is effectively cancelled out.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
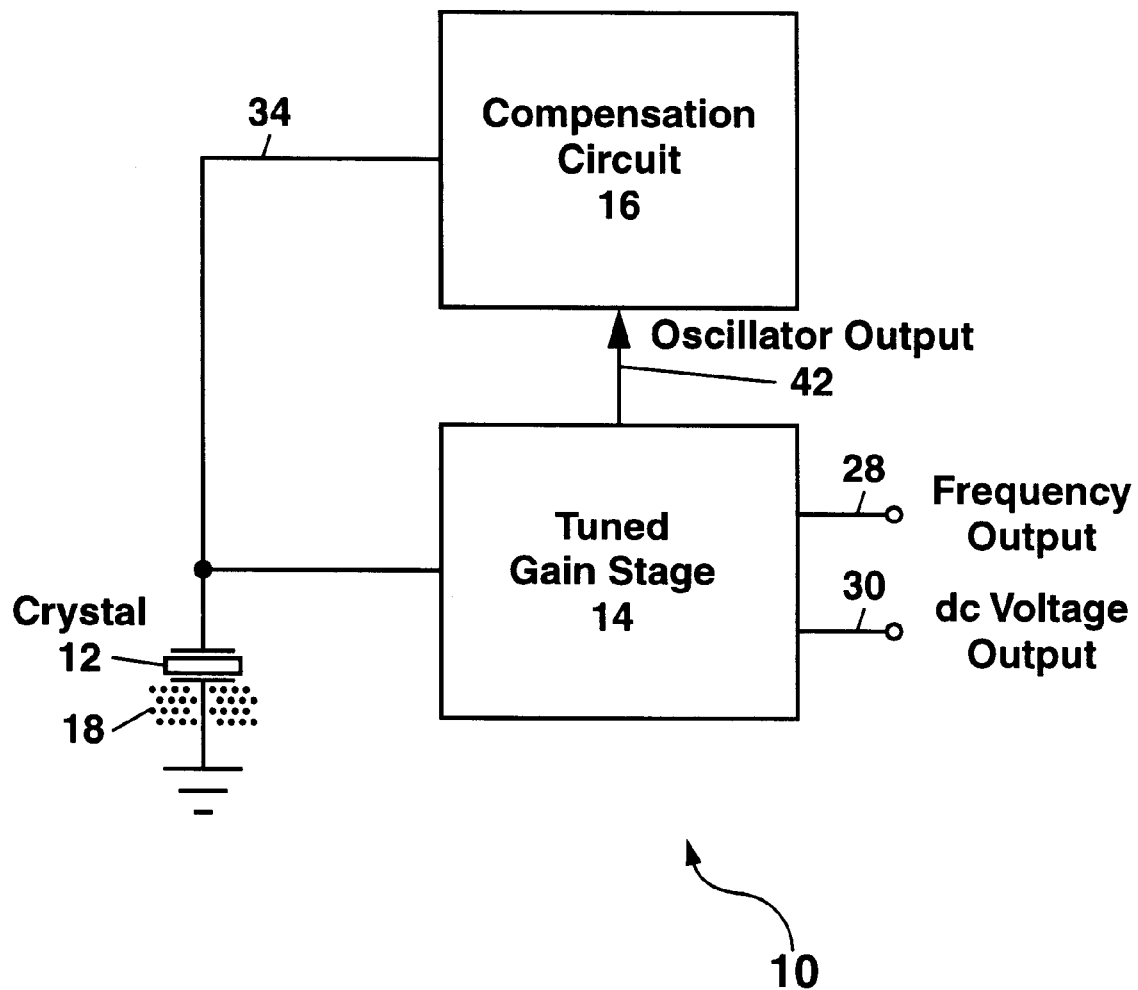
FIG. 1 shows a block diagram of the oscillator circuit of the present invention.
Figure 3:
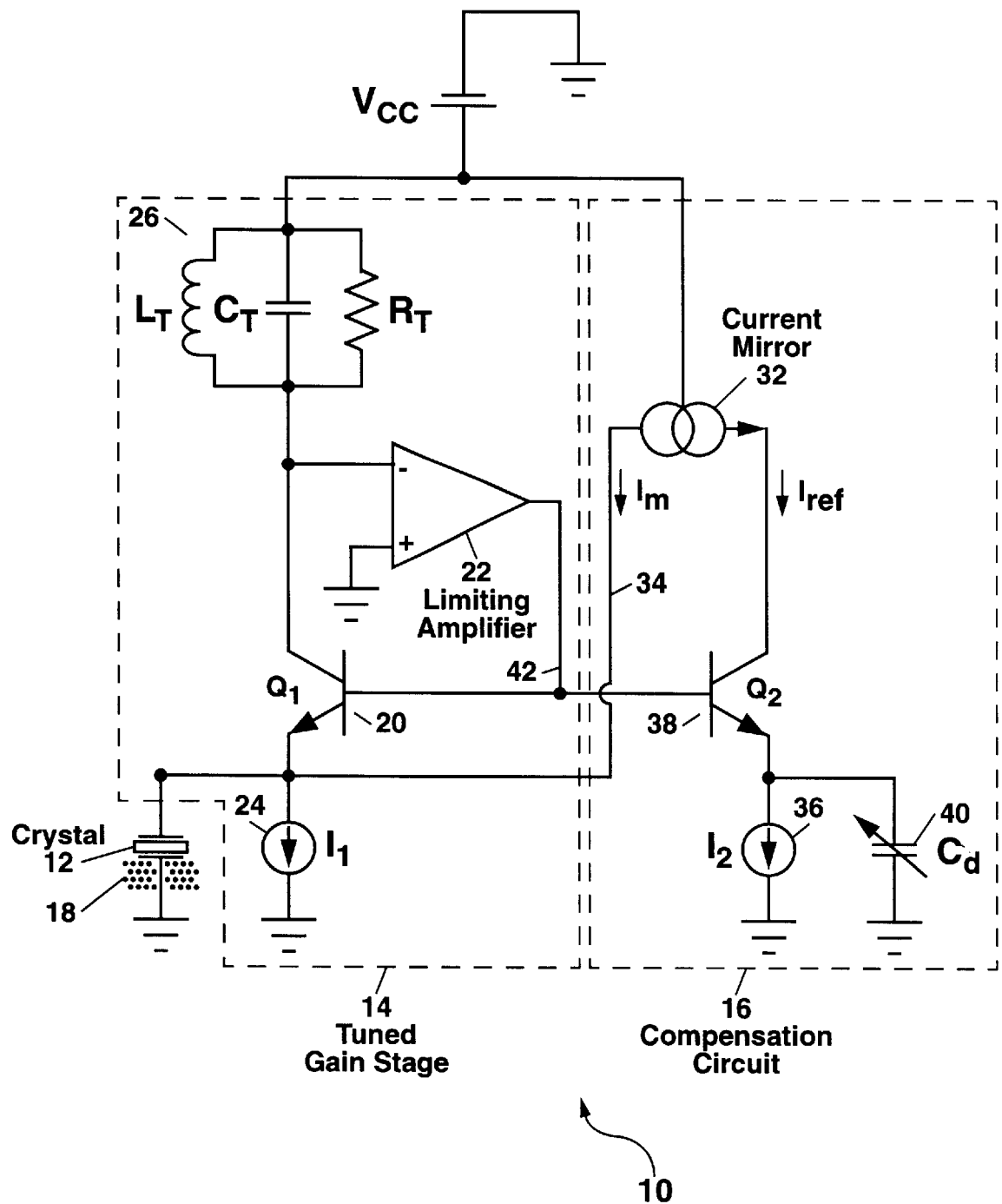
FIG. 3 shows a schematic diagram of an example of the oscillator circuit of FIG. 1.

Referring to FIG. 1, there is shown a block diagram of an oscillator circuit 10 according to the present invention for driving a piezoelectric crystal 12. In FIG. 1, the oscillator circuit 10 comprises a tuned gain stage 14 and a compensation circuit 16. The compensation circuit 16 is used to generate an alternating-current (ac) current component 34 that is equal in magnitude and phase to an ac current flowing through a shunt capacitance (i.e. $C_0+C_p$) associated with the crystal 12 as the crystal is driven into oscillation by positive feedback in the gain stage 14. The ac current component 34, which is produced by the compensation circuit 16 in response to an output 42 from the oscillator that is provided as an input to the compensation circuit 16 as shown in FIG. 1, effectively nulls out any effect due to the shunt capacitance on operation of the crystal 12 since the ac current flowing through the shunt capacitance is completely supplied by the compensation circuit 16 instead of being supplied by the gain stage 14. This allows the gain stage 14 to generate a frequency output signal 28 that depends to a much greater extent on a motional arm of the crystal 12 (i.e. $L_m$, $C_m$ and $R_m$ as shown in FIG. 3), and to further generate a direct-current (dc) voltage output signal 30 which depends on a resonator loss component, $R_m$, in the motional arm. The frequency output signal 28 and the dc voltage output signal 30 provide information about the properties (e.g. viscosity and density) of a viscous, fluid or solid medium 18 when an exposed surface of the crystal 12 is contacted by that medium 18; and this information can be used for sensing the presence or amount of that medium 18 in contact with the exposed surface of the crystal 12.

The oscillator circuit 10 of the present invention is useful for sensing many different types of viscous, fluid or solid media 18 in such diverse applications as measuring the condition of working fluids in machines, measuring the effectiveness of cleaning operations for removing contaminants from a surface of a workpiece, measuring the solidification of constituents within petroleum-based compositions (e.g. crude oil and hydrocarbon compositions formed therefrom) at various points from recovery through refining, storage and use, etc. These and other applications for which the oscillator circuit 10 of the present invention can be used are disclosed, for example, in U.S. Pat. Nos. 5,661,233; 5,706,840; 5,741,961; 5,798,452; and 5,827,952 which are all incorporated herein by reference. Those skilled in the art will also understand that the oscillator circuit 10 of the present invention can be used for many other applications, including deposition monitoring.

Figure 2:
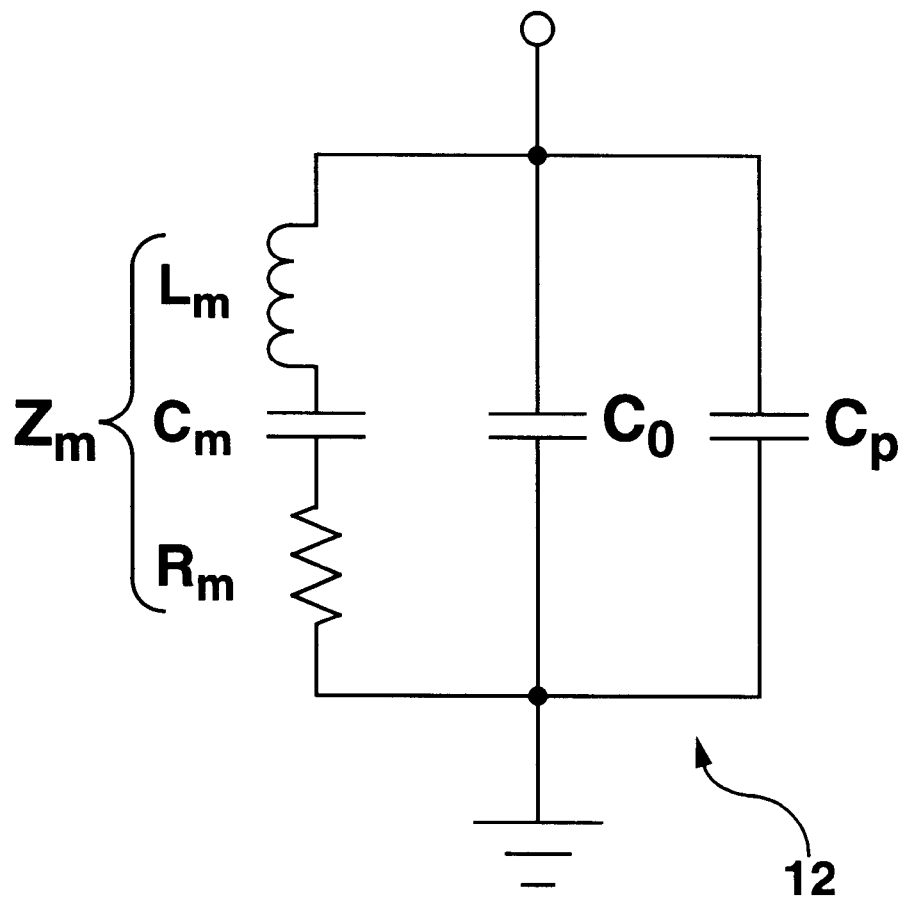
FIG. 2 shows an equivalent circuit for the piezoelectric crystal including a motional arm containing an inductance, $L_m$, a capacitance, $C_m$, and a resistance, $R_m$; a static capacitance, $C_0$, within the crystal; and a parasitic capacitance, $C_p$, which depends upon the geometry of a housing for the crystal and upon electrodes on the surfaces of the crystal for activation thereof. The series resonance frequency, $f_s$, is defined by $Z_m=0$, where $Z_m$ is an overall series impedance of the motional arm of the piezoelectric crystal.

FIG. 2 shows an equivalent circuit for the piezoelectric crystal 12 including a motional arm containing an inductance, $L_m$, a capacitance, $C_m$, and a resistance, $R_m$; a static capacitance, $C_0$, which occurs within the crystal; and a parasitic capacitance, $C_P$ which arises from a housing (i.e. packaging) for the crystal and also from electrodes on the surfaces of the crystal for activation thereof. The static capacitance, $C_0$, arises from parallel plating of the resonator structure (i.e. due to capacitance within the crystal 12 due to electrodes deposited on the surfaces of the crystal 12); whereas $C_p$ arises from shunt capacitance external to the crystal (e.g. due to the housing, electrodes and wiring for the crystal).

The piezoelectric crystal 12 comprises a piezoelectric crystalline material such as AT-cut crystalline quartz, lithium niobate or lithium tantalate. Those skilled in the art will understand that the oscillator circuit 10 of the present invention can be used with any type of piezoelectric material that allows shear deformations to be electrically excited therein.

The piezoelectric crystal 12 can be provided as a plate with lateral dimensions of, for example, one inch in diameter and a up to a few tenths of a millimeter thick. The surfaces of the piezoelectric crystal 12 can be lapped and polished; and patterned metal electrodes are deposited on both surfaces of the crystal 12 to allow for electrical excitation of the crystal 12 at a frequency, f, that is near a series resonance frequency, $f_s$, with the exact frequency of oscillation, f, further depending upon a loading of the crystal 12 by contact with a viscous, fluid or solid medium 18 which will affect the values of $L_m$, $C_m$ and $R_m$ in the motional arm of the crystal 12.

One surface of the crystal 12 is preferably electrically grounded as shown in FIG. 1, and the other surface of the crystal 12 is maintained at an ac electrical potential by connection to the oscillator circuit 10. The series resonance frequency, $f_s$, of the piezoelectric crystal 12 will in general depend upon the thickness and type of the crystal 12 and can be, for example, in the range of 1–100 MHz. For many sensing applications, the resonance frequency, $f_s$, is selected to be about 5 MHz.

The resistance, $R_m$, of the piezoelectric crystal 12 (also referred to herein as the resonator loss) can vary widely depending on whether or nor one or both surfaces of the crystal 12 are contacted by the viscous, fluid or solid medium 18. As an example, the resistance, $R_m$, can be about 10–30 Ohms for a one-inch diameter AT-cut quartz crystal 12 when operated in the oscillator circuit 10 without any contact of an exposed surface of the crystal 12. When the exposed surface of the quartz crystal 12 is contacted by a viscous medium 18, the resistance, $R_m$, can increase by up to several orders of magnitude (e.g. up to a few kiloOhms). The oscillator circuit 10 of the present invention is designed to sustain oscillation of the piezoelectric crystal 12 over this widely varying crystal resistance $R_m$.

FIG. 3 shows an example of the oscillator circuit 10 of FIG. 1 in greater detail. Here, the tuned gain stage 14 comprises a first transistor 20 (also referred to herein as $Q_1$) with a limiting amplifier 22 connected between the inverting output of transistor $Q_1$ and the input thereof to provide positive feedback for producing oscillation at a frequency defined by the crystal 12 which is connected between the non-inverting output of transistor $Q_1$, and a ground connection to the power supply, $V_{cc}$. The power supply, $V_{cc}$, can provide a dc voltage of, for example, 5 volts.

Those skilled in the art will understand that $Q_1$ can comprise a bipolar transistor or a field-effect transistor (FET). A bipolar transistor comprises a base, an emitter and a collector, with the input of the transistor being at the base, with the non-inverting output of the transistor being at the emitter, and with the inverting output of the transistor being at the collector. An FET comprises a gate, a drain and a source, with the input of the FET being at the gate, with the non-inverting output of the FET being at the drain, and with the inverting output of the FET being at the source. Those skilled in the art will further understand that when the crystal 12 is stated as being connected to the non-inverting output of transistor $Q_1$, such connection can be an ac connection made through a coupling capacitor (e.g. capacitor $C_7$ in FIG. 4).

A side of the crystal 12 containing the exposed surface preferably has an electrically grounded electrode thereto since this side of the crystal 12 is used to contact the viscous, fluid or solid medium 18. The other side of the crystal 12, which is connected to the non-inverting output of transistor $Q_1$, has an electrode that is maintained at the ac electrical potential generated by the gain stage 14. By contacting the medium 18 with a grounded side of the crystal 12, any effects of the ac electrical potential on the medium 18 and any effects of the medium 18 on the ac electrical potential are avoided. If the medium 18 is not electrically conductive and is not detrimentally affected by the ac electrical potential, then both surfaces of the crystal 12 can contact the medium 18.

In the gain stage 14, a current source 24 (also denoted herein as 11) can also be connected between the non-inverting output of $Q_1$ and ground for direct-current (dc) biasing of the transistor $Q_1$. This current source, 11, can be set to provide a dc bias current of, for example, 4 mA at the non-inverting output of transistor $Q_1$, with one-half of the 4 mA dc bias current being supplied by a current mirror 32 in the compensation circuit 16 so that the transistor $Q_1$ is biased at a dc current of 2 mA. Those skilled in the art will understand that the dc bias currents described herein are provided by way of illustration, and that other values of the dc bias currents can be selected for other embodiments of the oscillator circuit 10 of the present invention.

A low-Q (e.g. 5–10) tank circuit 26 having an inductance, $L_T$, a capacitance, $C_T$, and a resistance, $R_T$, is also provided in the gain stage 14 to provide a frequency-selective real impedance load at the inverting output of transistor $Q_1$ at the series resonance frequency, $f_s$. The tank circuit thus limits operation of the oscillator circuit to a range of frequencies near the resonance frequency, $f_s$, of the piezoelectric crystal 12, with the exact frequency of oscillation, f, being dependent on the motional arm of the crystal 12. The resistance, $R_T$, shown in FIG. 3 can be located in part or entirely within the limiting amplifier as in FIG. 4 which shows an implementation of the oscillator circuit 10 of FIG. 1 for operating a quartz crystal 12 at a resonance frequency of 5 MHz using bipolar transistor circuitry.

The tank circuit 26 can be tuned by temporarily substituting a low-value (e.g. 100 $\Omega$) resistor (not shown) in place of the piezoelectric crystal 12. The tank circuit 26 can then be adjusted (e.g. by varying the values of $L_T$ and/or $C_T$) so that the frequency output signal 28 is approximately equal to a desired oscillator frequency (e.g. the resonance frequency, $f_s$).

In FIG. 3, the limiting amplifier 22 is preferably a differential amplifier having one input (e.g. a negative input) that is connected to the inverting output of transistor $Q_1$ (e.g. through a coupling capacitor, $C_1$, than can be, for example, 1 $\mu$F), and having another input that is electrically grounded at the frequency of oscillation, f (e. g. connected to ground electrical potential through another coupling capacitor, $C_2$, having a capacitance of, for example, 0.1 $\mu$F). The limiting amplifier 22 provides an output that is limited in magnitude to, for example, 500 mV peak-to-peak. This amplifier 22 also provides sufficient gain for oscillation of the piezoelectric crystal 12 without requiring any automatic gain control in the gain stage 14. The output of the limiting amplifier 22 will generally be clipped and square-wave shaped, and will remain so until the resonator loss, $R_m$, becomes so large that the loop gain in the gain stage 14 is decreased to a point where all waveforms become sinusoidal.

Figure 4:
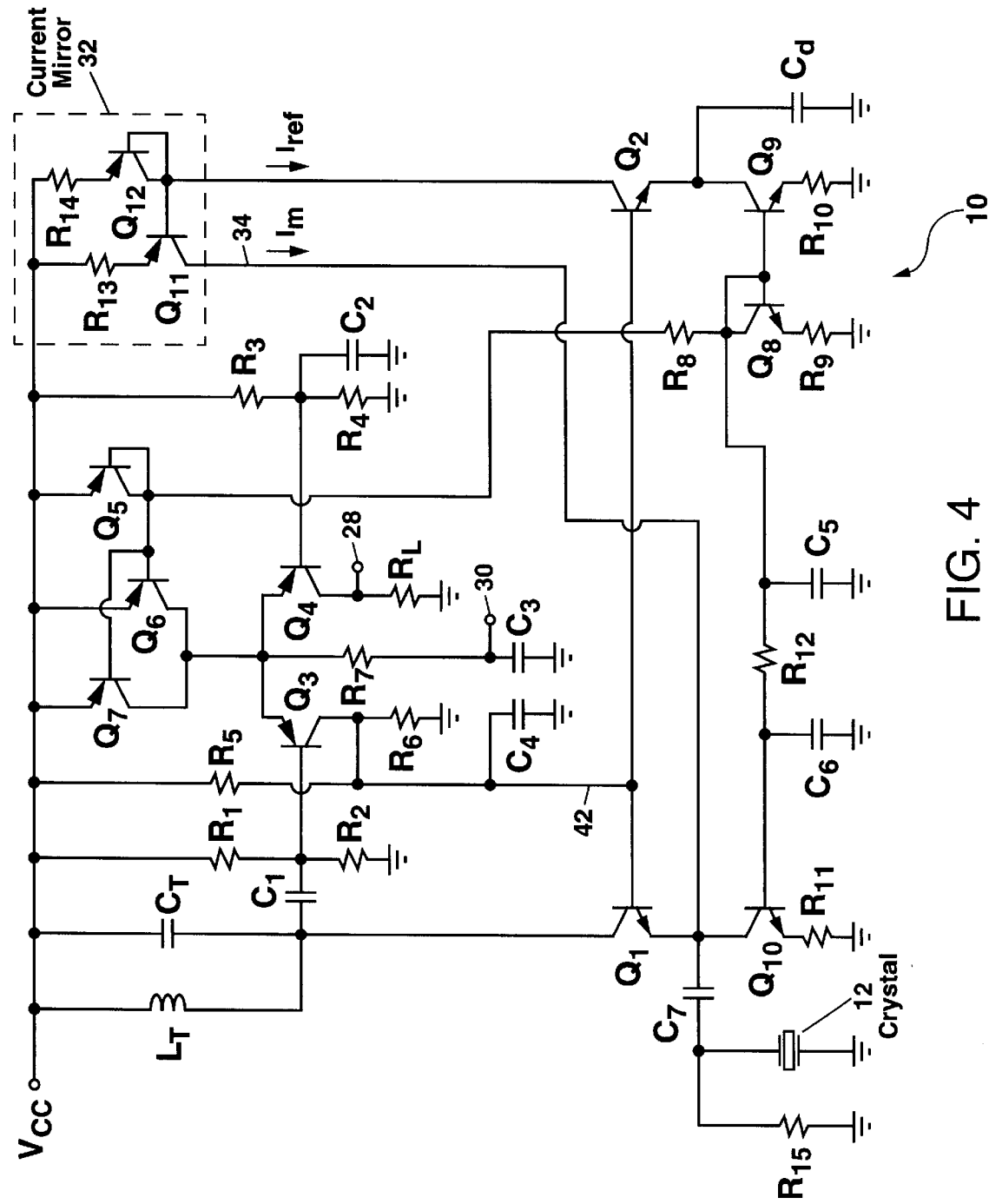
FIG. 4 shows an implementation of the oscillator circuit of FIGS. 1 and 3.

As shown in FIGS. 1 and 4, the limiting amplifier 22 preferably provides a frequency output signal 28 that is representative of the frequency of oscillation, f, of the crystal 12 (i.e. the frequency output signal 28 is at the frequency, f, although the signal 28 need not be sinusoidal at all times). The limiting amplifier 22 also preferably provides a dc voltage output signal 30 as shown in FIGS. 1 and 4, and which is representative of a resonator loss component of the crystal 12 (i.e. the output 30 varies in proportion to a change in the resistance, $R_m$, of the crystal 12). Together, the outputs 28 and 30 can be used to characterize a viscous, fluid or solid medium 18 that is contacted by the crystal 12 due to the effect of the medium 18 on the oscillating frequency, f, of the crystal and also due to the effect of the medium 18 on changing the resistance, $R_m$, of the crystal 12.

In the example of the present invention in FIG. 3, the compensation circuit 16 comprises a current mirror 32 which provides an output 34 to the crystal 12, with the output 34 comprising both a dc current component and an ac current component. The ac current component of the output 34 supplies an ac current flowing through the shunt capacitance (i.e. $C_0 + C_p$) associated with the crystal 12 so that this ac current need not be provided by the gain stage 14. As a result, any loading effect of the shunt capacitance on the gain stage 14 is minimized or eliminated completely, so that the frequency of oscillation, f, of the crystal 12 depends solely on the motional arm (i.e. $L_m$, $C_m$ and $R_m$) of the crystal 12. This means that any change in the frequency of oscillation, f, in response to contact of an exposed surface of the crystal 12 by a viscous, fluid or solid medium 18 can be directly related to properties of the medium 18 and will not be affected by the shunt capacitance associated with the crystal 12.

In FIG. 3, the current mirror 32 is responsive to a reference current, $I_{ref}$, in one arm thereof and generates a mirror current, $I_m$, another arm (i.e. an output 34) that is identical to or directly related to the reference current, $I_{ref}$ in all respects. Those skilled in the art will understand that there are many different ways of forming current mirrors depending on the particular type of circuit elements used (e.g. NPN or PNP bipolar transistors, field-effect transistors, or cascode devices) and other considerations (e.g. temperature compensation). An example of a current mirror 32 formed according to the present invention using bipolar transistors is shown in FIG. 4. Further details on the construction and operation of various types of current mirrors, which are well known to the art and are also referred to as current-controlled current sources or constant-current stages, using different types of transistors (e.g. bipolar transistors, field-effect transistors and cascode devices) can be found in electronic circuit design handbooks (see e.g. *The Circuits and Filters Handbook*, W.-K. Chen, Ed., CRC Press, New York, 1995, pp.349–351,1619–1624, 1694–1695, 1700–1701; *Electronic Engineer's Handbook*, D. G. Fink and D. Christiansen, Eds., McGraw-Hill Company, New York, 1989, pp.8-46–8-47).

In FIG. 3, the reference current, $I_{ref}$, and the mirror current, $I_m$, both have dc and ac components, and are preferably identical in all respects. The the dc component of $I_{ref}$ and $I_m$ is set by a second current source 36 (also indicated herein as 12) that is used to bias a second transistor 38 (also referred to herein as $Q_2$) The current source 36 can be set to provide a dc bias current of, for example, $I_2$=2 mA. This results in $I_{ref}$ and $I_m$ each having a dc current component equal to the bias current $I_2$ in the oscillator circuit 10 of FIG. 3.

The ac current component of $I_{ref}$ and $I_m$ is determined by a reference capacitor 40 (also denoted herein as $C_d$) when transistor $Q_2$ is modulated at the ac frequency of oscillation, f, by connecting the input of transistor $Q_2$ to the input of transistor $Q_1$ and also to the output 42 of the limiting amplifier 22. The ac component of $I_m$ is preferably set to supply an ac current that would otherwise be generated by transistor $Q_1$ and which would flow through the shunt capacitance ($C_0+C_p$) associated with the piezoelectric crystal 12. As a result, when the ac current flowing through the shunt capacitance is completely supplied by the current mirror 32 in the compensation circuit 16, transistor $Q_1$ will no longer supply any ac current to the shunt capacitance and thus the gain stage 14 will no longer be affected by any loading due to the shunt capacitance associated with the crystal 12. Thus, the oscillator circuit 10 of the present invention actively cancels out the presence of the shunt capacitance of the crystal 12 on the gain stage 14 so that the shunt capacitance has very little, if any, affect the oscillating frequency, f, of the crystal 12.

For effective compensation, the ac current component in the output 34 of the current mirror 32 is determined by selecting a value of capacitance for the reference capacitor 40 that is equal to the shunt capacitance associated with the crystal 12 (i.e. $C_d=C_0+C_p$). The capacitance of the reference capacitor 40 can be on the order of a few picoFarads to tens of picoFarads (e.g. 1–50 $_pF$), and will depend on the type and size of the piezoelectric crystal 12 used with the oscillator circuit 10, and on the packaging and wiring associated with the crystal 12. Alternately, the reference capacitor 40 can be provided as a variable capacitor (or a combination of a fixed capacitor and a variable capacitor) that can be adjusted during calibration of the oscillator circuit 10 to closely match the shunt capacitance associated with the crystal 12. This can be done, for example, by using an impedance analyzer to determine the resonance frequency, $f_s$, of the crystal 12 with the crystal 12 removed from the circuit 10 and connected to the impedance analyzer, and without any loading of the exposed surface of the crystal 12 (i.e. without any viscous, fluid or solid medium 18 contacting the exposed surface of the crystal 12). The crystal 12 can then be placed back into the circuit 10 and the reference capacitor 40 adjusted as needed to provide a frequency of oscillation, f, at the frequency output 28 which is as close as possible to the resonance frequency, $f_s$, with the crystal 12 being loaded (e.g. by placing a piece of tape on the exposed surface of the crystal 12 to simulate contact of the exposed surface by a viscous medium 18).

FIG. 4 shows an implementation of the oscillator circuit 10 of FIGS. 1 and 3 using bipolar circuitry for operating a quartz crystal 12 at a frequency, f, near 5 MHz using a 5 volt dc supply voltage, $V_{cc}$. Those skilled in the art will understand that other circuit designs can be formed based on the teachings of the present invention for operating at the same or different frequencies, and for operating at the same or a different supply voltage. Furthermore, those skilled in the art will understand that the oscillator circuit 10 of the present invention can be formed with other types of transistors, including field effect transistors. Those skilled in the art will also understand that all or part of the oscillator circuit 10 of the present invention can be formed as a discrete circuit, as a hybrid circuit or as an integrated circuit (IC). In forming an IC, certain circuit elements (e.g. $C_d$, $L_T$ and $C_T$)can be located external to the IC so that the user can configure the IC for operation with different piezoelectric. crystals 12 having different values of shunt capacitances or operating having different resonance frequencies, $f_s$. In other embodiments of the present invention, the crystal 12 can be connected to the oscillator circuit 10 through an transformer, if this is needed for impedance matching (e.g. when using a field-effect transistor for $Q_1$).

In the oscillator circuit 10 of FIG. 4, the limiting amplifier 22 is formed by transistors $Q_3$ and $Q_4$, with these transistors being biased at 4 mA total dc current provided by transistors $Q_5$–$Q_7$ which operate in a current mirror arrangement with a 2 mA dc reference current being provided at the connection between the input and inverting output of transistor $Q_5$ by the current source 12 which is formed by transistors $Q_8$ and $Q_9$. The negative input of the limiting amplifier 22 in FIG. 4 at transistor $Q_3$ is capacitively coupled to the inverting output of transistor $Q_1$ through capacitor $C_1$. A dc bias voltage for the input of transistor $Q_3$ of the limiting amplifier 22 is determined by resistors $R_1$ and $R_2$, which taken in parallel form the resistance, $R_T$, of the tank circuit 26. The inverting output of transistor $Q_3$ is coupled back to the input of transistor $Q_1$ to provide the positive feedback for oscillation, with the output of transistor $Q_3$ being limited to, for example, 500 mV peak-to-peak by the selection of resistor $R_6$ and by a dc bias current for transistor $Q_3$ which is set to be 2 mA by transistors $Q_5$–$Q_7$. Exemplary values of the various circuit elements in the implementation of the oscillator circuit 10 of FIG. 4 are presented in Table 1.

The dc bias voltage for the positive input of the limiting amplifier 22 at transistor $Q_4$ is similarly determined by resistors $R_3$ and $R_4$, with the dc bias current being, for example, 2 mA as determined by transistors $Q_5$–$Q_7$. The positive input of the limiting amplifier is ac-coupled to ground through capacitor $C_2$. A positive feedback output 42 (i.e. the oscillator output in FIG. 1, and also referred to herein as the limiting amplifier output) of the limiting amplifier 22 is connected to the inputs of transistors $Q_1$ and $Q_2$, with resistors $R_5$ and $R_6$ setting the dc bias voltages for these transistors, and with each transistor $Q_1$ and $Q_2$ being biased at a dc current of, for example, 2 mA (i.e. transistor $Q_1$ is biased by the dc current component of $I_m$, and

TABLE 1

| $R_1$ | 2 kΩ | $R_2$ | 4 kΩ |
| $R_3$ | 2 kΩ | $R_4$ | 4 kΩ |
| $R_5$ | 450 Ω | $R_6$ | 300 Ω |

TABLE 1-continued

| | | | |
|---|---|---|---|
| $R_7$ | 300 kΩ | $R_8$ | 1.6 kΩ |
| $R_9$ | 400 Ω | $R_{10}$ | 400 Ω |
| $R_{11}$ | 200 Ω | $R_{12}$ | 100 Ω |
| $R_{13}$ | 100 Ω | $R_{14}$ | 100 Ω |
| $R_{15}$ | 5.36 kΩ | $R_L$ | 300 Ω |
| $C_1$ | 1 μF | $C_2$ | 0.1 μF |
| $C_3$ | 0.1 μF | $C_4$ | 10 pF |
| $C_5$ | 0.1 μF | $C_6$ | 0.1 μF |
| $C_7$ | 1 μF | $C_T$ | 100 pF |
| $L_T$ | 10 μH | $C_d$ | 1–3 pF | transistor $Q_2$ is biased by the dc current within $I_{ref}$ produced by current source 12). Capacitor $C_4$ can be provided between the output 42 of the limiting amplifier 22 and ground to prevent oscillation of the gain stage 14 above a certain cutoff frequency for the oscillator circuit 10.

The frequency output signal 28 is provided at the inverting output of transistor $Q_4$ across a load resistor $R_L$ in FIG. 4, which typically has a resistance of a few hundred Ohms (e.g. 300Ω). The dc voltage output signal 30 is provided in the limiting amplifier 22 at the connection between resistor $R_7$ and capacitor $C_3$ as shown in FIG. 4. This dc voltage output signal 30, which provides a nonlinear measurement of resonator loss, $R_m$, within the crystal 12 when the exposed surface of the crystal 12 is contacted with a viscous, fluid or solid medium 18, can be optionally compensated to first order for temperature changes in the circuit 10 by providing another transistor (not shown) of the opposite polarity compared to transistors $Q_3$ and $Q_4$ in the gain stage 14. The signal 30 is then connected to the input of this additional transistor; and the temperature-compensated dc voltage output signal can be obtained at the non-inverting output of this transistor. This transistor can be dc biased using another current source (not shown) located between the non-inverting output and ground.

In the implementation of the oscillator circuit 10 in FIG. 4, the current source $I_2$ is formed by transistors $Q_8$ and $Q_9$ and resistors $R_8$, $R_9$ and $R_{10}$. Transistor $Q_8$ in the current source $I_2$ is also used to drive the current source $I_1$ formed from transistor $Q_{10}$ and resistor $R_{11}$ through a low-pass filter comprising resistor $R_{12}$ and capacitors $C_5$ and $C_6$.

The current mirror 32 in the circuit implementation of FIG. 4 can be formed from transistors $Q_{11}$ and $Q_{12}$ and resistors $R_{13}$ and $R_{14}$. The dc component of the reference current, $I_{ref}$, and of the mirror current, $I_m$, are both equal to 2 mA for the implementation of FIG. 4. This provides a 2 mA dc current component at the non-inverting output of transistor $Q_1$ which results in transistor $Q_1$, being biased at a 2 mA dc current since current source $I_1$ is set to provide a total $_4$ mA dc current between the non-inverting output of transistor $Q_1$ and ground.

The ac current component of the output 34 of the current mirror 32 is coupled through capacitor $C_7$ to the crystal 12 to supply the entire alternating current flow through the shunt resistance associated with the crystal 12 at the frequency of oscillation, f, so that none of this current flow need come from transistor $Q_1$ in the gain stage 14. A shunt resistor $R_{15}$ can be optionally provided across the piezoelectric crystal 12 as shown in FIG. 4 to reduce any loading of the motional resistance, $R_m$, on the gain stage 14. The resistance of resistor $R_{15}$ can be about equal to a maximum value of the motional resistance, $R_m$, under an expected loading of the crystal 12 by the viscous, fluid or solid medium 18.

Other applications and variations of the oscillator circuit 10 of the present invention will become evident to those skilled in the art. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A oscillator circuit for operating a piezoelectric crystal at a frequency of oscillation near a series resonance of the crystal, comprising:

(a) a tuned gain stage, further comprising a limiting amplifier located in a feedback loop about a transistor, with a non-inverting output of the transistor being connected to drive the crystal at the frequency of oscillation, and with an inverting output of the transistor being connected to a resonant tank to suppress oscillation of the crystal at frequencies other than near the series resonance; and (b) a compensation circuit having an input connected to an output of the limiting amplifier, and further having an output connected to the crystal at the non-inverting output of the transistor for cancelling out any effect on the frequency of oscillation produced by a shunt capacitance associated with the crystal.

2. The oscillator circuit of claim 1 wherein the tuned gain stage further includes a current source connected between the non-inverting transistor output and an electrical ground.

3. The oscillator circuit of claim 1 wherein the limiting amplifier comprises a pair of differential inputs, with one of the differential inputs being connected to an inverting output of the transistor, and with the other differential input being electrically grounded, and with the limiting amplifier further comprising a limiting amplifier output connected to an input of the transistor.

4. The oscillator circuit of claim 3 wherein the limiting amplifier provides a frequency output signal representative of the frequency of oscillation of the crystal.

5. The oscillator circuit of claim 3 wherein the limiting amplifier provides a direct-current (dc) voltage output signal representative of a resonator loss component of the crystal.

6. The oscillator circuit of claim 1 wherein the compensation circuit includes a current mirror.

7. The oscillator circuit of claim 6 wherein the current mirror provides an alternating-current (ac) current component at the non-inverting output of the transistor which is equal in magnitude and phase to a current flow through the shunt capacitance associated with the crystal at the frequency of oscillation, thereby supplying the current flow independent of the gain stage.

8. The oscillator circuit of claim 7 wherein the compensation circuit further comprises a reference capacitor for defining a value of the ac current provided by the current mirror.

9. The oscillator circuit of claim 8 wherein the reference capacitor comprises an variable capacitor.

10. The oscillator circuit of claim 9 wherein the variable capacitor provides a value of capacitance equal to the shunt capacitance associated with the crystal.

11. The oscillator circuit of claim 1 wherein the crystal is electrically grounded at one side thereof.

12. The oscillator circuit of claim 1 wherein the resonance frequency is in the range of 1–100 MHz.

13. A oscillator circuit to provide for oscillation of a piezoelectric crystal, comprising:

(a) a transistor having a limiting amplifier connected in a positive feedback configuration between an inverting output of the transistor and an input thereof, with a non-inverting output of the transistor being connected to drive the piezoelectric crystal into oscillation; and (b) a compensation circuit, having an input connected to the transistor input and providing an ac current component at the non-inverting output of the transistor which is equal in magnitude and phase to a current flowing through a shunt capacitance associated with the piezoelectric crystal, thereby completely providing any current flow through the shunt capacitance and effectively cancelling out any effect of the shunt capacitance on the oscillator circuit, or on a frequency of oscillation of the crystal.

14. The circuit of claim 13 wherein the limiting amplifier comprises a differential amplifier, with a first amplifier input capacitively coupled to the inverting output of the transistor, and with a second amplifier input capacitively coupled to an electrical ground.

15. The circuit of claim 13 wherein the limiting amplifier provides a frequency output signal indicative of the frequency of oscillation of the piezoelectric crystal, and a direct-current (dc) voltage output signal indicative of a resonator loss component of the piezoelectric crystal.

16. The circuit of claim 13 wherein the compensation circuit comprises a current mirror for providing the ac current component.

17. The circuit of claim 16 wherein the compensation circuit further includes a reference capacitor connected to the current mirror through another transistor which has an input connected to the output of the limiting amplifier, and with the reference capacitor determining the magnitude of the ac current component provided by the current mirror.

18. The circuit of claim 17 wherein the reference capacitor is adjustable for precisely canceling out the loading resulting from the shunt capacitance.

19. The circuit of claim 13 wherein one side of the piezoelectric crystal is connected to a non-inverting output of the transistor, and another side of the piezoelectric crystal is electrically grounded.

20. A oscillator circuit for operating a piezoelectric crystal at a frequency of oscillation at or near a series resonance, comprising:

(a) a first transistor having a limiting amplifier connected in a positive feedback configuration between an inverting output of the first transistor and an input thereof, with a non-inverting output of the first transistor being further connected to one side of the piezoelectric crystal, and with the other side of the piezoelectric crystal being electrically grounded;

(b) a current mirror connected between an inverting output of a second transistor and the non-inverting output of the first transistor, with the second transistor further having an input connected to the first transistor input, and with the current mirror generating an alternating-current (ac) current component sufficient to supply any current flowing through a shunt capacitance associated with the piezoelectric crystal, thereby effectively cancelling out the shunt capacitance.

21. The oscillator circuit of claim 20 wherein the second transistor is further connected at a non-inverting output thereof to a reference capacitor, with the reference capacitor determining the magnitude of the ac current component generated by the current mirror.

22. The oscillator circuit of claim 21 wherein the reference capacitor is adjustable for precisely cancelling out the shunt capacitance.

23. The oscillator circuit of claim 22 further including a first current source connected in parallel with the piezoelectric crystal, and a second current source connected in parallel with the reference capacitor for dc biasing of the first and second transistors.

24. The oscillator circuit of claim 20 wherein the first and second transistors, the limiting amplifier and the current mirror are formed as an integrated circuit.

25. A oscillator circuit for operating a piezoelectric crystal at a frequency of oscillation near a series resonance frequency, comprising:

(a) a first transistor having an input, an inverting output and a non-inverting output, with the piezoelectric crystal being connected between the non-inverting output and a ground connection to a power supply, and with the inverting output of the first transistor being connected to the power supply through a tank circuit;

(b) a first current source connected between the non-inverting output of the first transistor and the ground connection in parallel with the piezoelectric crystal;

(c) a limiting amplifier having an input connected to the inverting output of the first transistor and an output connected to the input of the first transistor to provide feedback for oscillation of the piezoelectric crystal at the frequency of oscillation;

(d) a second transistor having an input, an inverting output and a non-inverting output, with the input of the second transistor being connected to the input of the first transistor, and with a reference capacitor being connected between the non-inverting output of the second transistor and the ground connection;

(e) a second current source connected between the non-inverting output of the second transistor and the ground connection in parallel with the reference capacitor; and (f) a current mirror connected between the inverting output of the second transistor and the power supply and further providing an alternating-current (ac) current component at the frequency of oscillation to the non-inverting output of the first transistor, with a magnitude and phase of the ac current component being controlled by the reference capacitor to be equal to the magnitude and phase of an ac current flowing through a shunt capacitance associated with the piezoelectric crystal, thereby effectively cancelling out the shunt capacitance.

26. The oscillator circuit of claim 25 wherein the reference capacitor comprises a variable capacitor.

* * * * *